United States Patent [19]
Tajima

[11] Patent Number: 5,647,430
[45] Date of Patent: Jul. 15, 1997

[54] ELECTRONIC COMPONENT COOLING UNIT

[75] Inventor: Makoto Tajima, Tokyo, Japan

[73] Assignee: Calsonic Corporation, Tokyo, Japan

[21] Appl. No.: 618,151

[22] Filed: Mar. 19, 1996

[30] Foreign Application Priority Data

Mar. 20, 1995 [JP] Japan ................................ 7-061307

[51] Int. Cl.$^6$ ........................................................ F28D 15/00
[52] U.S. Cl. .................... 165/104.33; 257/715; 361/700; 361/702; 165/104.21
[58] Field of Search ........................ 165/104.33, 104.21; 257/715, 714; 361/702, 701, 700

[56] References Cited

U.S. PATENT DOCUMENTS

| | | | |
|---|---|---|---|
| 1,693,324 | 11/1928 | Stephens | 165/104.33 |
| 2,958,021 | 10/1960 | Cornelison et al. | 165/104.33 X |
| 4,293,030 | 10/1981 | Rambach | 165/104.33 X |
| 4,549,603 | 10/1985 | Shirai et al. | 165/104.33 |
| 4,633,371 | 12/1986 | Nagy et al. | 361/385 |
| 4,833,567 | 5/1989 | Saaski et al. | 361/385 |
| 4,912,548 | 3/1990 | Shanker et al. | 357/82 |
| 5,168,919 | 12/1992 | Berenholz et al. | 165/104.33 X |
| 5,216,580 | 6/1993 | Davidson et al. | 165/104.33 X |
| 5,252,778 | 10/1993 | Ogawa | 165/104.33 X |
| 5,305,184 | 4/1994 | Andresen et al. | 165/104.33 X |
| 5,323,292 | 6/1994 | Brzezinski | 165/104.33 X |
| 5,331,510 | 7/1994 | Ouchi et al. | 361/702 |
| 5,396,947 | 3/1995 | Itoh | 165/104.14 |
| 5,529,115 | 6/1996 | Paterson | 165/104.33 |

FOREIGN PATENT DOCUMENTS

| | | | |
|---|---|---|---|
| 1266244 | 5/1961 | France | 165/104.33 |
| 0021441 | 2/1978 | Japan | 165/104.33 |
| 55-75198 | 5/1980 | Japan. | |
| 0131755 | 8/1983 | Japan | 165/104.33 |
| 0589631 | 1/1978 | U.S.S.R. | 165/104.33 |

*Primary Examiner*—John Rivell
*Assistant Examiner*—Christopher Atkinson
*Attorney, Agent, or Firm*—Sughrue, Mion, Zinn, Macpeak & Seas

[57] ABSTRACT

In an electronic component cooling unit, one surface of a cold plate, on the other surface of which an electronic component is mounted, is covered with a cover member to form a tank section which accommodates refrigerant, and a pipe member is fitted in the cover member in such a manner as the pipe member is communicated with the tank section. Furthermore, the one surface of the cold plate has a recess which forms the tank section together with the cover member. The pipe member is a multi-flow-path container which is formed by extrusion molding.

5 Claims, 3 Drawing Sheets

ELECTRONIC COMPONENT COOLING UNIT

BACKGROUND OF THE INVENTION

The present invention relates to an electronic component cooling unit which is used to cool an electronic component such as a rectifier diode which generates heat.

A heat sink for cooling an electronic component such as a rectifier diode which generates heat has been disclosed, for instance, by Japanese Utility Model Unexamined Publication No. Sho. 55-75198.

The heat sink is as shown in FIG. 7. In the heat sink, an electronic component 13 such as a rectifier diode is fixedly mounted on one side of a mounting member 11, on the other side of which a plurality of heat radiating plates 17 (hereinafter referred to as "radiating plates 17", when applicable) is mounted.

Corrugated radiating fins 19 (hereinafter referred to merely as "radiating fins 19", when applicable) are arranged between the heat radiating plates 17.

In the heat sink, the heat generated by the electronic component 13 is transmitted through the mounting member 11 and the radiating plates 17 to the radiating fins 19, and then radiated into the outside air through the radiating fins 19. Hence, the electronic component 13 is effectively cooled.

However, the conventional heat sink designed as described above suffers from the following difficulties: The electronic component 13 is cooled by natural heat radiation with the aid of the radiating plates 17 and the corrugated radiating fins 19. Hence, the sink is low in cooling efficiency.

In addition, the sink suffers from a problem in the case where the electronic component 13 is bulky; that is, it is large in the amount of heat radiation. In this case, it is necessary to increase the length of the radiating plates 17. However, as the radiating plates 17 are elongated, the efficiency with which the radiating plates 17 transmit heat to the radiating fins is lowered as much as the thermal conductivity. Hence, even if the number of radiating fins 19 is increased to increase the heat radiating area, the cooling power is not increased so much. This means that it is difficult to more effectively radiate the heat from the electronic component 13.

SUMMARY OF THE INVENTION

Accordingly, an object of the invention is to eliminate the above-described difficulties accompanying a conventional electronic component cooling unit. More specifically, an object of the invention is to provide an electronic component cooling unit which is much higher in electronic-component cooling efficiency than a conventional one.

In an electronic component cooling unit according to a first aspect of the invention, one surface of a cold plate, on the other surface of which an electronic component is mounted, is covered with a cover member, to form a tank section which accommodates refrigerant; a pipe member is fitted in the cover member in such a manner as the pipe member is communicated with the tank section; and with the tank section and the pipe member evacuated, the refrigerant is sealed in the pipe member and the tank section.

An electronic component cooling unit according to a second aspect of the invention is characterized in that in the cooling unit of the first aspect, the one surface of the cold plate has a recess which forms the tank section.

An electronic component cooling unit according to a third aspect of the invention is characterized in that in the cooling unit of the first or second aspect, the pipe member is bent, and communicated with the tank section through both ends thereof.

An electronic component cooling unit according to a fourth aspect of the invention is characterized in that in the cooling unit of the first, second or third aspect, the pipe member is a multi-flow-path container which is formed by extrusion molding and has a flattened cross section.

In the electronic component cooling unit of the first aspect, the heat generated by the electronic component mounted on one surface of the cold plate is transmitted to the other (opposite) surface of the cold plate.

The refrigerant in the tank section is evaporated by the heat thus transmitted, and caused to flow up the pipe member. While flowing up the pipe member, the refrigerator performs exchange of heat with the outside air, so that it is cooled and condensed. That is, it is liquified, thus flowing down the pipe member into the tank section.

In the electronic component cooling unit of the second aspect, the cold plate has the recess which forms the tank section. Hence, the heat generated by the electronic component is transmitted to the recess with high efficiency.

In the electronic component cooling unit of the third aspect, the pipe member is bent, and communicated with the tank member through its both ends. This feature eliminates the troublesome work of sealing the ends of the pipe member.

In the electronic component cooling unit of the fourth aspect, the multi-flow-path container which is formed by extrusion molding is employed as the pipe member. Hence, a number of pipe passageways can be formed readily and positively.

DETAILED DESCRIPTION OF THE PREFERRED EMBODIMENTS

The invention will be described with reference to its preferred embodiments shown in the accompanying drawings in detail.

Figure 1:
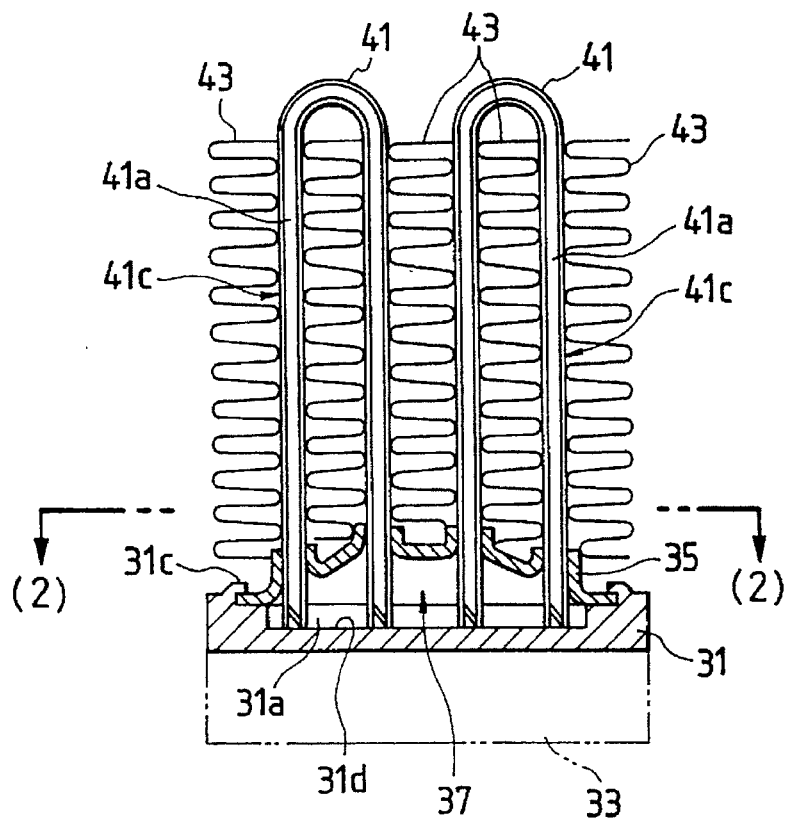
FIG. 1 is a sectional view showing an example of an electronic component cooling unit, which constitutes a first embodiment of the invention.
Figure 2:
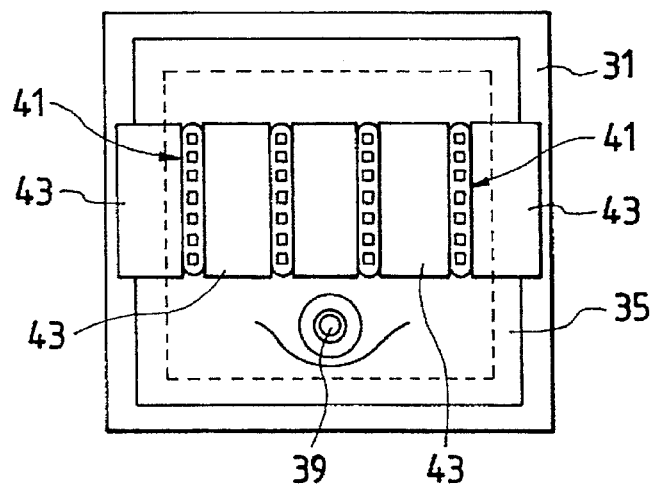
FIG. 2 is a sectional view taken along line (2)—(2) in FIG. 1.

FIGS. 1 and 2 show an example of an electronic component cooling unit, which constitutes a first embodiment of the invention. In FIGS. 1 and 2, reference numeral 31 designates a rectangular cold plate.

The cold plate 31 is made of a metal material such as aluminum high in thermal conductivity.

An electronic component 33 such as an LSI, or a multi-chip module (MCM) formed by integrating LSIs is bonded through an adhesive agent high in thermal conductivity onto one surface of the cold plate 31.

Figure 3:
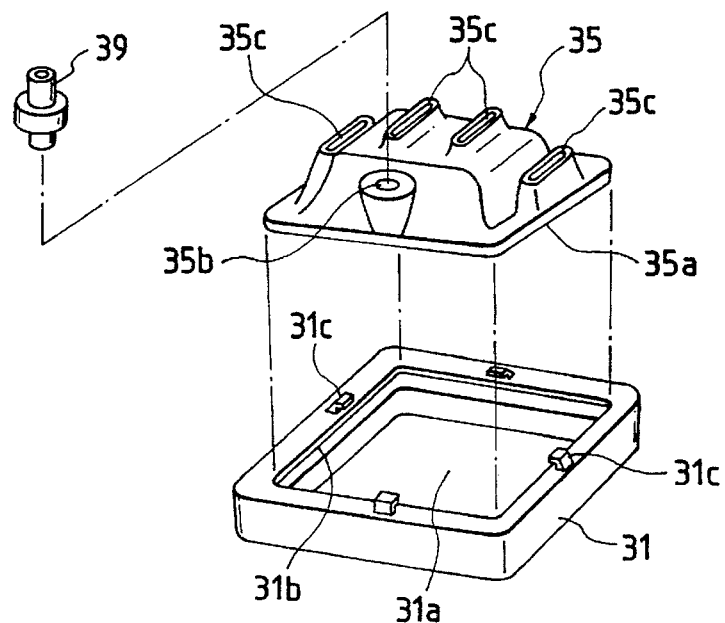
FIG. 3 is an exploded perspective view showing a cold plate and a cover member in the cooling unit.

The other (opposite) surface of the cold plate 31 has a rectangular recess 31a as shown in FIG. 3.

The rectangular recess 31a has an engaging recess 31b along its periphery, and caulking pawls 31c are formed outside the engaging recess.

The bottom 35a of a rectangular cover member 35 is engaged with (fitted in) the engaging recess 31b, and then fixedly secured to the cold plate 31 with the caulking pawls 31c.

The cover member 35 and the recess 31a of the cold plate 31 form a tank section 37.

The cover member 35 is also made of a metal material such as aluminum high in thermal conductivity.

The cover member 35 has a refrigerant pouring inlet 35b, which is sealed with a sealing member 39.

The cover member 35 has elongated-hole-shaped mounting holes 35c, into which multi-flow-path containers 41 are inserted.

The containers 41 are also made of a metal material such as aluminum high in thermal conductivity.

The containers 41 are each formed by extrusion molding, in such a manner that it has a flattened cross section and it has a plurality of pipe passageways 41a which are arranged at predetermined intervals in the direction of width thereof.

The multi-flow-path containers 41 are each bent so as to be U-shaped, and both end portions thereof are fitted into the mounting holes 35c of the cover member 35, as was described before.

Figure 4:
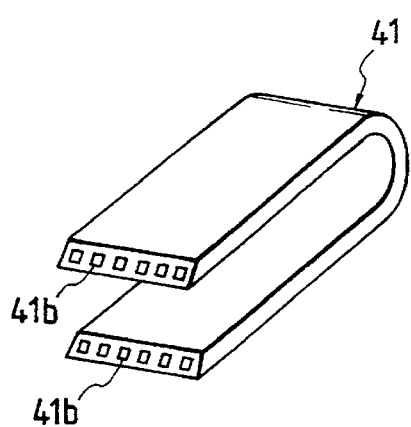
FIG. 4 is a perspective view of a multi-flow-path container shown in FIG. 1.

Each of the multi-flow-path containers 41 is obliquely cut as shown in FIG. 4. The tip of each of the cut surfaces 41b is brought into contact with the bottom surface 31d of the recess 31a of the cold plate 31.

Heat radiating fins 43 made up of corrugated fins are arranged at the heat exchanger sections 41c of the multi-flow-path containers 41.

The heat radiating fins 43 are also made of a metal material such as aluminum high in thermal conductivity.

The electronic component cooling unit thus constructed is assembled as follows: First, the bottom 35a of the cover member 35 is engaged with the engaging recess 31b of the cold plate 31, and the caulking pawls 31c are bent to fixedly secure the cover member 35 to the cold plate 31. Thereafter, both end portions of each of the multi-flow-path containers 41 are inserted into the mounting holes 35c of the cover member 35, and then the radiating fins 43 are installed on the containers 41.

The cooling unit thus roughly assembled is subjected to blazing in a blazing oven, so that all the components are formed into one unit.

Under this condition, a predetermined quantity of refrigerant such as water is poured into the tank section 37 through the refrigerant pouring inlet 35b formed in the cover member 35, and then air is removed from the tank section 37 and the containers 41 to a pressure of about $10^{-5}$ Torr through the refrigerant pouring inlet 35b, and the latter 35b is sealingly closed with the sealing member 39.

The electronic component cooling unit thus constructed functions as follows: The heat generated by an electronic component mounted on the one surface of the cold plate 31 is transmitted to the bottom 31d of the recess 31a formed in the cold plate 31.

The refrigerant in the tank section 37 is evaporated by the heat thus transmitted, and caused to flow up the pipe passageways 41a in the multi-flow-path containers 41. While flowing upwardly in the pipe passageways 41a, the refrigerant performs heat exchange with the outside air, so that it is cooled and condensed; that is, it is liquified. The refrigerant thus liquified flows down the pipe passageways 41a into the tank section 37.

As was described above, in the electronic component cooling unit, the refrigerant in the tank section 37 is evaporated by the heat generated by the electronic component, and caused to flow up the pipe passageways 41a of the multi-flow-path containers 41. And, while flowing upwardly in the pipe passageways 41a, the refrigerant performs heat exchange with the outside air, so that it is cooled and condensed; that is, it is liquified. The refrigerant thus liquified flows down the pipe passageways 41a into the tank section 37. Hence, the electronic component cooling unit of the invention is much higher in electronic-component cooling efficiency than the conventional one.

That is, in the electronic component cooling unit of the invention, the latent heat of the refrigerant is utilized to lead the heat to the heat exchanger sections 41c which is generated by the electronic component. That is, the heat generated by the electronic component can be effectively led to the heat exchanger sections 41c. This feature markedly improves the electronic-component cooling efficiency of the electronic component cooling unit of the invention.

Thus, as compared with a conventional heat sink in which electronic components are cooled through natural heat radiation, the cooling unit of the invention can be made compact and can radiate a large amount of heat.

Furthermore, in the electronic component cooling unit, the cold plate 31 has the recess 31a which forms the tank section 37. Hence, the heat generated by the electronic component is transmitted to the recesses 31a with high efficiency.

- The multi-flow-path containers 41 are each bent so as to be U-shaped, and communicated through both end portions with the tank section 37. Hence, it is unnecessary to seal the end portions of the multi-flow-path containers 41, which improves the gas tightness of the cooling unit.

Moreover, in the electronic component cooling unit, the heat radiating fins 43 are arranged at the heat exchanger sections 41c of the containers 41. This feature improves the heat exchange efficiency of the refrigerant with the outside air.

In addition, in the electronic component cooling unit, a plurality of pipe passageways 41a are formed by using the multi-flow-path containers 41, and therefore they can be formed readily and positively. And the pipe passageways 41a are high in gas tightness.

Furthermore, in the electronic component cooling unit, the refrigerant flows uniformly over the whole surface of the cold plate, and therefore it has no heat spot. This feature positively protects the electronic component 33.

Figure 5:
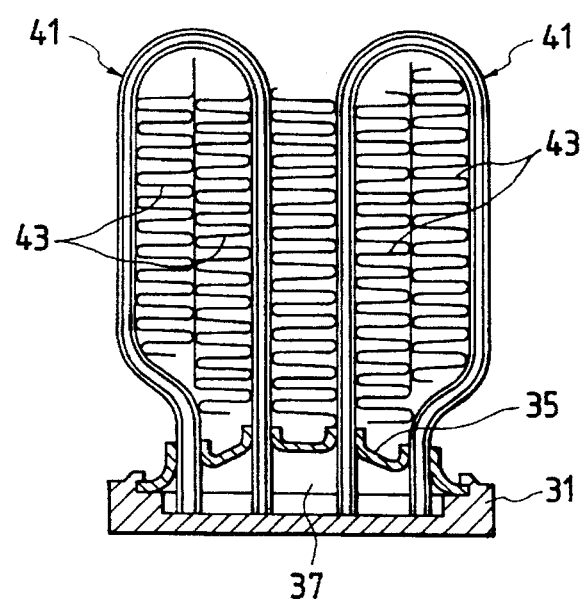
FIG. 5 is a sectional view showing another example of the electronic component cooling unit, which constitutes a second embodiment of the invention.
Figure 6:
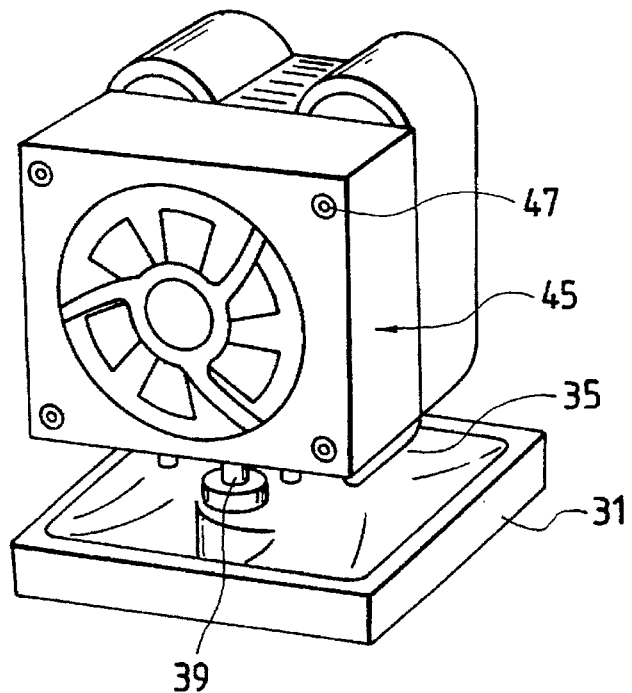
FIG. 6 is a perspective view of the electronic component cooling unit shown in FIG. 5.
Figure 7:
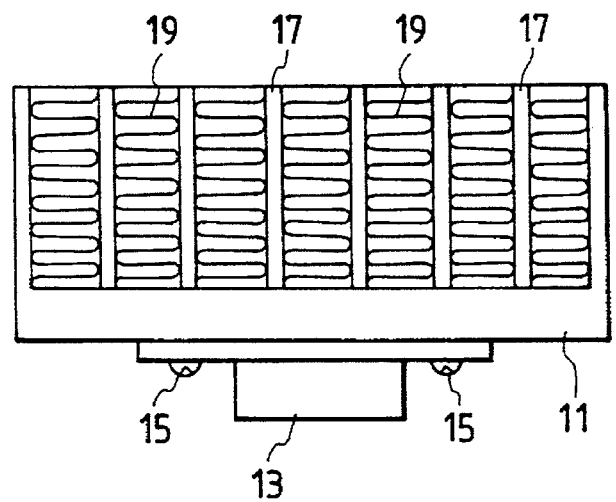
FIG. 7 is a side view showing a conventional heat sink.

FIGS. 5 and 6 show another example of the electronic component cooling unit, which constitutes a second embodiment of the invention. In the second embodiment, radiating fins 43 are arranged only inside the multi-flow-path containers 41.

A fan 45 is fixedly installed outside the multi-flow-path containers 41 with screws 47.

In the second embodiment, the fan 45 is operated to positively lead the air out of the cooling unit which has been heated by the heat radiating fins 43.

In the above-described embodiments, the technical concept of the invention is applied to an electronic component such as an MCM; however, the invention is not limited thereto or thereby. That is, the invention may be applied wide to a variety of electronic components which generate heat.

Furthermore, in those embodiments, the multi-flow-path containers each of which has a number of axially extended passageways, are employed as the pipe members; however, the invention is not limited thereto or thereby. For instance, instead of the multi-flow-path containers, a plurality of pipes may be employed in combination.

As was described above, in the electronic component cooling unit of the first aspect of the invention, the refrigerant in the tank section is evaporated by the heat thus transmitted, and caused to flow up the pipe member. While flowing up the pipe member, the refrigerator performs heat exchange with the outside air, so that it is cooled and condensed. That is, it is liquified, thus flowing down the pipe member into the tank section. Hence, the electronic component cooling unit of the invention is much higher in electronic component cooling efficiency than the conventional one.

In the electronic component cooling unit of the second aspect of the invention, the cold plate has the recess which forms the tank section. Hence, the heat generated by the electronic component is transmitted to the recess with high efficiency.

In the electronic component cooling unit of the third aspect of the invention, the pipe member is bent, and communicated with the tank member through of its both ends. This feature eliminates the troublesome work of sealing the ends of the pipe member. That is, the electronic component cooling unit is improved in gas tightness as much.

In the electronic component cooling unit of the fourth aspect of the invention, the multi-flow-path container which is formed by extrusion molding is employed as the pipe member. Hence, a number of pipe passageways can be formed readily and positively.

What is claimed is:

1. An electronic component cooling unit, comprising:

a cold plate having one surface and another surface, an electronic component being mounted on said one surface of said cold plate;

a cover member covering said other surface of said cold plate, said cold plate and said cover member forming a tank section which accommodates a refrigerant; and a pipe member mounted to said cover member and comprising a multi-flow-path container with a flattened cross-section, having opposite open ends, and which is bent so that said opposite open ends of said pipe member are communicated with said tank section;

wherein said tank section and said pipe member are evacuated, and said refrigerant is sealed in said pipe member and said tank section.

2. An electronic component cooling unit as claimed in claim 1, wherein said other surface of said cold plate has a recess which forms said tank section.

3. An electronic component cooling unit as claimed in claim 1, wherein said multi-flow-path container is extrusion molded.

4. An electronic component cooling unit as claimed in claim 3, further comprising a corrugated fin disposed at said multi-flow-path container.

5. An electronic component cooling unit as claimed in claim 2, wherein said opposite open ends of said pipe member are cut to form oblique surfaces such that a tip of each oblique surface contacts a bottom surface of said recess.

* * * * *